(12) United States Patent
Altmann et al.

(10) Patent No.: US 9,564,523 B1
(45) Date of Patent: Feb. 7, 2017

(54) NON-LINEAR SPIN-ORBIT INTERACTION DEVICES AND METHODS FOR CURRENT-TO-SPIN CONVERSION AND AMPLIFICATION OF SPIN-POLARIZATIONS

(71) Applicant: International Business Machines Corporation, Armonk, NY (US)

(72) Inventors: Patrick B. Altmann, Rueschlikon (CH); Gian von Salis, Rueschlikon (CH)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/966,411

(22) Filed: Dec. 11, 2015

(51) Int. Cl.
| | | |
|---|---|---|
| *G11C 11/16* | (2006.01) | |
| *H03K 19/23* | (2006.01) | |
| *H01L 29/66* | (2006.01) | |
| *H01L 29/45* | (2006.01) | |
| *H01L 29/06* | (2006.01) | |

(52) U.S. Cl.
CPC ......... *H01L 29/66984* (2013.01); *H01L 29/06* (2013.01); *H01L 29/45* (2013.01); *H03K 19/23* (2013.01)

(58) Field of Classification Search
CPC .... H01L 29/66984; H01L 29/06; H01L 29/45; H03K 19/23
USPC ............................................ 326/35; 365/171
See application file for complete search history.

(56) References Cited

U.S. PATENT DOCUMENTS

| | | |
|---|---|---|
| 7,939,912 B2 | 5/2011 | Nikonov et al. |
| 2013/0154633 A1 | 6/2013 | Fujiwara et al. |
| 2013/0314985 A1* | 11/2013 | Fuhrer ................ G11C 11/1673 365/171 |

FOREIGN PATENT DOCUMENTS

WO 2013043225 A1 3/2013

OTHER PUBLICATIONS

Y. Kajiwara et al.,; "Transmission of Electrical Signals by Spin-Wave Inter-Conversion in a Magnetic Insulator" Nature; Mar. 11, 2010; vol. 464; pp. 262-266.

* cited by examiner

*Primary Examiner* — Daniel D Chang
(74) *Attorney, Agent, or Firm* — Cantor Colburn LLP; Daniel Morris

(57) ABSTRACT

The present invention is notably directed to a spin-orbit coupled device. This device comprises a confinement part. It further includes a circuitry, having an input device, energizable to inject spin-polarizations to charge carriers in an input region of the confinement part. The circuitry further comprises an output device, usable to detect spin-polarizations of charge carriers in an output region of the confinement part. The confinement part may be is configured to subject charge carriers drifting therein to a non-linear spin-orbit interaction, which causes to rotate a spin polarization of the drifting charge carriers by an angle that depends non-linearly on momenta of such charge carriers. The circuitry may be configured to allow momenta of charge carriers drifting in the confinement part to be varied, while injecting spin-polarizations in the input region. Varying momenta allows spin-polarizations of drifting charge carriers to be rotated, owing to said non-linear spin-orbit interaction.

19 Claims, 4 Drawing Sheets

NON-LINEAR SPIN-ORBIT INTERACTION DEVICES AND METHODS FOR CURRENT-TO-SPIN CONVERSION AND AMPLIFICATION OF SPIN-POLARIZATIONS

BACKGROUND

The invention relates generally to the field of spintronics. In particular, it relates to devices and methods relying on non-linear spin-orbit interactions to enable functionalities such as current-to-spin conversion and amplification of spin-polarization.

Spintronics is a field of electronics where the spin-momentum of a charge carrier is used in addition to its charge to generate or process signals. Signals can be processed in terms of communication, storage, sensing or logic applications.

A number of concepts have been proposed that are based on the electron spin. In particular, spin devices have been proposed, which include a spin transport layer (or STL) above a substrate. Connected to the STL are input and output electrodes. The input electrodes act as spin injection contacts and consist of a magnetic material that is magnetized into one of two possible directions (spin up/down). By passing a current between the input electrodes and the STL, spin-polarized electrons can be accumulated in the STL at the interface between the input electrode and the STL. The spin polarization of electrons at that location in the STL is directly related to the magnetization of the input electrode, i.e. the spins in the STL are also either up or down. The output electrodes convert the local spin polarization at the interface between the STL and the output electrode. Spin polarization can, e.g., be converted into an electrical signal. The concepts of input and output electrodes acting as spin injection and spin detection contacts are well known. Between the input and output electrodes, the spin polarization imprinted by the input electrode propagates by diffusion or drift.

In addition, logic gates are known, which use majority-logic concepts, where several input electrodes polarize the electron spin in the STL and the output electrode detects the average spin polarization that diffuses from those input electrodes to the output electrode.

As it can be realized, the spin of charge carriers can be manipulated in both ferromagnetic materials and materials enabling spin-orbit interaction. While devices based on ferromagnetic materials are well established in today's technology landscape, spin-orbit coupled systems are still lacking some basic functionality.

SUMMARY

According to a first aspect, an embodiment is provided for a spin-orbit coupled device. This device comprises a confinement part, designed to confine charge carriers (electrons or holes) drifting therein. It is further equipped with a circuitry, which comprises an input device, energizable to inject spin-polarizations to charge carriers in an input region of the confinement part. The circuitry further comprises an output device, usable to detect spin-polarizations of charge carriers in an output region of the confinement part. In an embodiment, the confinement part is configured to subject charge carriers drifting therein to a non-linear spin-orbit interaction, which causes to rotate a spin polarization of the drifting charge carriers by an angle that depends non-linearly on momenta of such charge carriers. In another embodiment, the circuitry is configured to allow momenta of charge carriers drifting in the confinement part to be varied, while injecting spin-polarizations in the input region. Varying the momenta of the travelling carriers allows their spin-polarizations to be rotated, owing to said non-linear spin-orbit interaction. Embodiments provide for converting an electrical current (i.e., the current associated to momenta of drifting charge carriers) into a desired spin-polarization.

In an embodiment, a cubic spin-orbit interaction is contemplated, whereby an energy associated to the non-linear spin-orbit interaction depends on a third power of momenta of the charge carriers.

In an embodiment, a voltage is applied across the confinement part, so as for the electrical current associated to charge carrier momenta to vary according to this voltage. Voltage can for instance be applied across the confinement part via a drain contact and a ferromagnetic contact, each in electrical communication with the confinement part.

According to another aspect, an embodiment is provided for a spin-amplification system. The system comprises a spin-orbit coupled device as described above and a spintronic device. The spintronic device is configured to obtain charge carriers having given spin polarizations in an output region thereof. The circuitry of the spin-orbit coupled device may further comprise a spin-to-current converter coupling the spintronic device to the input region of the spin-orbit coupled device, such that spin-polarizations can be injected in the input region in accordance with a current produced by the spin-to-current converter based on spin polarizations of charge carriers as obtainable in the output region of the spintronic device. Embodiments provide the circuitry to amplify spin-polarizations as detectable in the output region with respect to spin-polarizations of charge carriers as obtainable in the output region of the spintronic device.

In an embodiment, a spin-orbit coupled device may be provided such that a spin-polarization of charge carriers is an oscillatory function of the electrical current associated to momenta of charge carriers drifting in the confinement part. By utilizing a linear regime of the function, the amplified spin-polarizations may be linearly dependent on the electrical current associated to drifting carriers.

In other embodiments, a utilization of a non-linear regime of the above oscillatory function is provided. In this embodiment distinct values of spin polarizations in the output region of the spintronic device result in essentially a same amplified value of spin-polarization. This provides for improvements in some embodiments such as majority-logic devices.

According to another embodiment, a method is provided for rotating spin-polarization in a spin-orbit coupled device, such as discussed above. It can further be embodied as a method for amplifying spin-polarizations, using a system as discussed above. The momenta of charge carriers drifting in the confinement part are varied (while injecting spin-polarizations in the input region of the device), so as to rotate spin-polarizations of the drifting charge carriers, owing to the non-linear spin-orbit interaction. Such methods provide for current-to-spin conversion, or spin amplification, as explained above.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
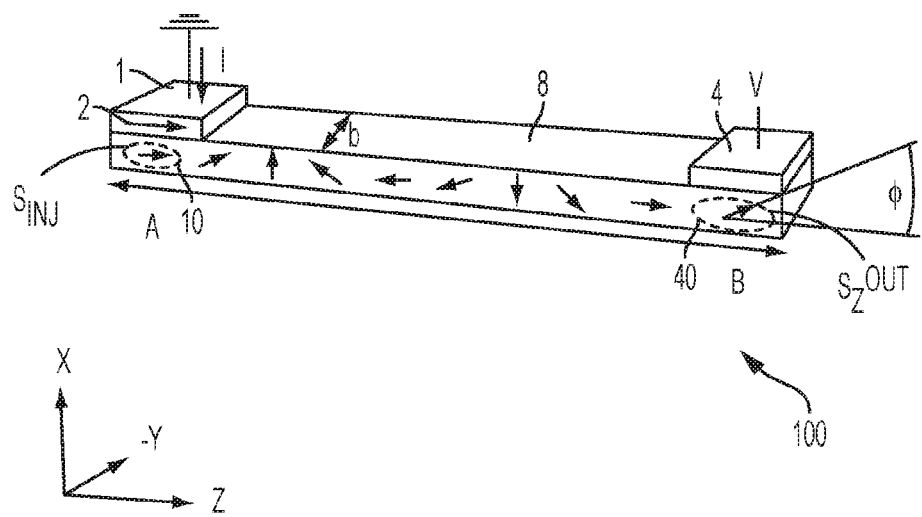
FIG. 1 depicts a 3D view of a spin-orbit coupled device for current-to-spin conversion, according to embodiments.

The following description is structured as follows. First, general embodiments and high-level variants are described. The next section addresses more specific embodiments and technical implementation details.

General Embodiments and High-Level Variants

In reference to FIGS. 1-4, an embodiment is first described, which concerns a spin-orbit coupled device 100. Note that "spin-orbit coupled device" is synonymous with "spin-orbit interaction device", i.e., a device enabling spin-orbit interaction.

This device 100 comprises a confinement part 8, which part is designed to confine charge carriers likely to drift therein. Present devices may rely on electron dynamics. In other embodiments, charge carriers may be holes, as non-linear spin-orbit interaction is also known to occur in hole-systems.

The confinement part 8 further comprises a circuitry 1, 4. This circuitry notably comprises an input device 1, which can be energized to inject spin-polarizations 2 to charge carriers in the input region 10 of the confinement part 8. This circuitry 1, 4 also comprises an output device 4, which can notably be used to detect spin-polarizations of charge carriers, in an output region 40 of the confinement part 8. The output device 4 is typically provided so as to detect average spin-polarizations 6. Typically, what is detected is a projection ("$S_z^{out}$") of the spin polarization onto the magnetization vector (z-axis) of a drain contact 40.

Remarkably here, the confinement part 8 is configured to subject charge carriers drifting therein to a non-linear spin-orbit interaction. As explained herein, a non-linear spin-orbit interaction will cause to rotate the spin polarizations of the drifting charge carriers by an angle that depends non-linearly on the momenta of the charge carriers. In addition, the circuitry 1, 4 is configured to allow momenta of charge carriers drifting in the confinement part 8 to be varied, while concomitantly injecting spin-polarizations in the input region 10.

As a result, spin-polarizations of the drifting charge carriers can be rotated, in accordance with the varied momenta and, this, by virtue of properties of the non-linear spin-orbit interactions. Thus, the above device allows converting an electrical current (associated to momenta of drifting charge carriers) into a desired spin-polarization direction, e.g., a positive spin-polarization or a negative spin-polarization of the charge carriers, along direction z. The magnitude of the spin-polarization state at the level of the output region 40 of the spin-orbit coupled device 100 can be varied, by suitably varying the carrier momenta. In other words, the present approach relies on charge carriers drifting in a non-linear (e.g., cubic) spin-orbit coupled system, to convert electrical current arising due to the drifting charge carriers into a desired spin-polarization state, whereby directions and magnitudes of the output spins can be varied.

For example, spin-polarization may be varied by simply applying a voltage across the confinement part 8, so as to change the potential that the confinement part is subject to (e.g., the voltage may be changed from 0V to ±45 mV). The needed voltage may be applied via the above circuitry 1, 4. The electrical current associated to momenta of charge carriers drifting in the confinement part 8 will thus vary according to the voltage V applied via the circuitry 1, 4.

In embodiments, the circuitry is set to a fixed working point, i.e., where the voltage (once applied) is kept constant. In variants, the circuitry is further configured to allow the applied voltage to be varied, be it to be able to adapt/optimize the working point. In each of these cases, the voltage as experienced by charge carriers will change. In that respect, it is noted that, in general, the voltage (and thus the current through the channel) need be varied, in order to vary the spin polarization in the output. However, in other embodiments that relate to a spin amplifier (described herein in reference to FIGS. 3 and 7), the voltage (once applied) need not be further varied. Still, the current flowing through the channel 8 is effectively varied because of a varying spin-dependent resistance. All of the above embodiments exploit the fact that momenta of charge carriers drifting in the confinement part 8 can be varied.

Note that devices are already known, which make it possible to convert a spin polarization into a current signal, as noted in the introduction. However, present devices enable an opposite conversion concept (i.e., a current-to-spin conversion), which has not thus far been demonstrated. The main physical effect underlying embodiments herein (non-linear dependence of spin polarization on carriers momenta) should not be confused with the spin Hall effect, yielding a spin polarization that is proportional to a current (at lateral sides of a current-carrying channel), yet without involving any non-linear dependence of spin polarization on current.

In order to fabricate a spin-orbit coupled device, appropriate materials need be chosen, notably for the confinement part 8. Non-linear spin-orbit interactions exist notably in semiconductor crystals with bulk inversion asymmetry, as, e.g., crystals with zincblende structure e.g., III-V semiconductors like GaAs, InAs, InSb, GaSb and AlAs. In addition, other material classes are known to exhibit non-linear e.g., cubic spin-orbit interaction, like perovskites and transition-metal dichalcogenides. Furthermore hole-systems are known, which make use of materials that happen to have a strong cubic spin-orbit interaction. A spin-orbit coupled device may thus advantageously be designed based on such materials or, more generally, any material that exhibits substantial non-linear spin-orbit interactions.

In addition, other considerations come into play. To start with, the input 1 and output contacts 4 shall preferably be designed small compared to the spin-orbit length in the material 8 chosen (e.g., one fourth of the spin-orbit length or less). The spin-orbit length is that length over which spin-polarized charge carriers need to drift before their spin be rotated by 180 degrees. In addition, as diffusion reduces the amplitude of the output spin polarization, the device 100 is provided so as to reduce diffusion as much as possible. This can for instance be achieved by tuning the charge density (e.g., the electron sheet density), temperature, scattering mechanisms and confinement in quasi-1D wires (in lateral channels of widths smaller than the spin-orbit length).

In embodiments, the confinement part 8 is configured so as for charge carriers drifting therein to experience a cubic spin-orbit interaction. I.e., the spin-orbit interaction energy depends significantly on the third power of momenta of the charge carriers, in addition to a constant term and a linear term. For instance, because of the spin-orbit interaction, a moving electron experiences an effective magnetic field, about which the electron's spin precesses. In the case of linear spin-orbit interaction, the interaction energy depends linearly on the electron momentum. As a consequence, the precession angle ϕ of a spin that moves from A to B (cf. FIG. 1) with a drift velocity $v_D$ depends only on the separation distance l between A and B (cf. FIG. 1). Namely, assuming a two-dimensional area, in which carriers are confined:

$$\phi = \frac{2m^*}{\hbar^2}\beta_1 v_D t = \frac{2m^*}{\hbar^2}\beta_1 l \quad (1)$$

Here, $\beta_1$ is the strength of the linear spin-orbit interaction, m* is the effective mass, t is the time needed to travel the distance l and ℏ is the reduced Planck's constant. The precession angle ϕ can be obtained from the spin-orbit interaction energy $E_{so}$ by dividing it by the reduced Planck constant and multiplying it by the time t, i.e., $$E_{SO} = \frac{2m^*}{\hbar}\beta_1 v_D$$

in the case of linear spin-orbit interactions.

If, instead, the spin-orbit interaction energy is cubic (i.e., the interaction depends on the cube of the electron momentum), the precession angle ϕ of the spin depends not only on the distance travelled but also on the velocity. Assuming (again) a two-dimensional system, the precession angle ϕ can, in such cases, be written as $$\phi = -\frac{2\pi m^* n_S}{\hbar^2}\gamma l - \frac{m^{*3}}{\hbar^4}\gamma v_D^2 l, \quad (2)$$

where $n_s$ is the sheet density of the two-dimensional carrier gas and γ is the strength of the cubic spin-orbit interaction.

Several parameters impact the spin-orbit coupled device 100. As seen in the above formula, such parameters may include: (i) the materials used for the confinement (which notably determine $n_s$ and γ, and impact the drift velocity $v_D$); the design of the device 100 (which notably determines l); and (iii) the applied voltage V (which impacts the drift velocity $v_D$). Note that once the materials have been chosen, some leeway remains as to the voltage range, which impacts the drift velocity $v_D$ and, in turn, the non-linear contribution to the precession angle ϕ. Still, all the above parameters may be provided (starting with the choice of materials for the confinement part 8) so as to be able to achieve drift momenta of the charge carriers that are a substantial fraction (e.g., 10% or more) of the Fermi momentum, for the cubic term to provide a substantial contribution.

In embodiments, the input device 1 of the spin-orbit coupled device 100 comprises a ferromagnetic contact 1, in electrical communication (e.g., in contact) with the confinement part 8, as illustrated in FIGS. 1-4. Suitable spin injection may notably occur through spin transfer from a ferromagnetic layer 1 into the confinement layer 8, by means of photoexcitation or by any spin-dependent transport process, as in, e.g., spin-dependent tunneling. A preferred injection mechanism, though, is one that relies on tunneling from a ferromagnetic layer.

The output device 4 of the spin-orbit coupled device 100 may comprise a drain contact 4, in electrical communication with the confinement part 8. The circuitry 1, 4 may accordingly be configured to apply (and possibly vary) a voltage V applied across the confinement part 8 via the drain contact 4 and the ferromagnetic contact 1. The drain contact 4 is preferably located opposite to the ferromagnetic contact 1, e.g., at an opposite end of the confinement region 8, as illustrated in FIGS. 1-3.

Figure 2:
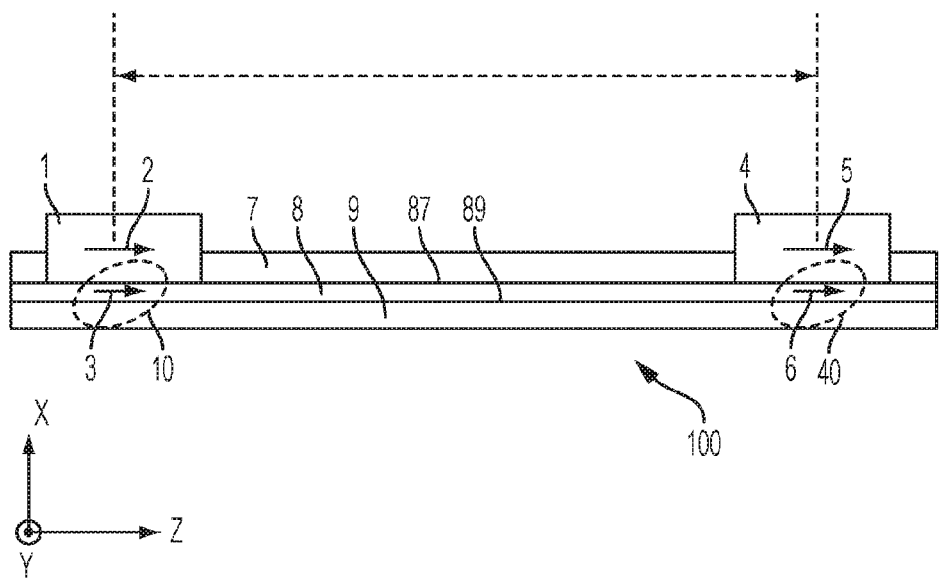
FIG. 2 depicts a 2D cross-sectional view of the device of FIG. 1 (showing more details as to the confinement part of this device), according to embodiments.
Figure 3:
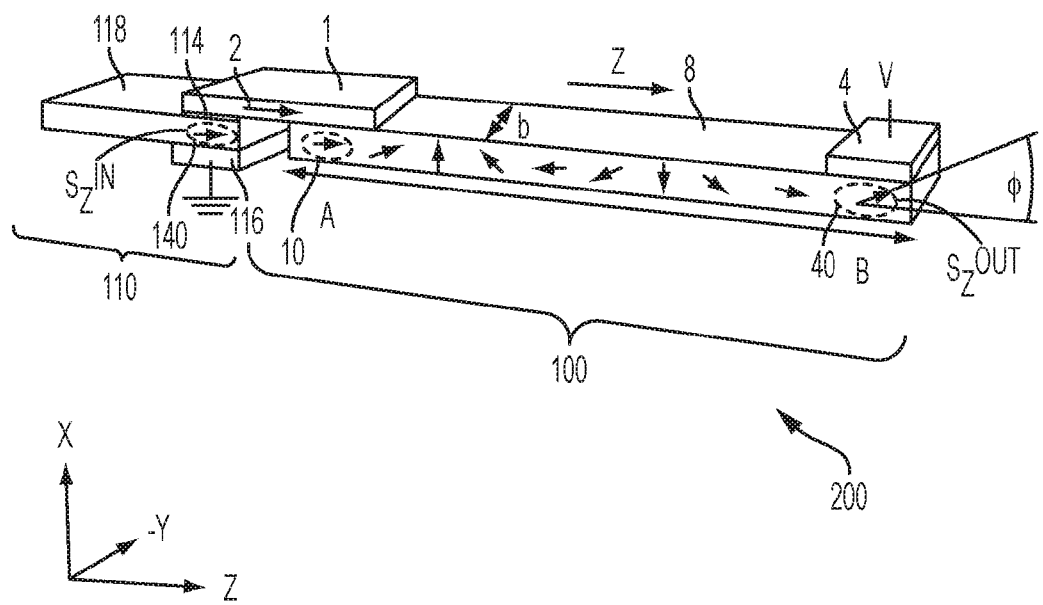
FIG. 3 depicts a 3D view of a system wherein a spintronics device is coupled to a spin-orbit coupled device such as depicted in FIG. 1 to allow for spin amplification, according to embodiments.
Figure 4:
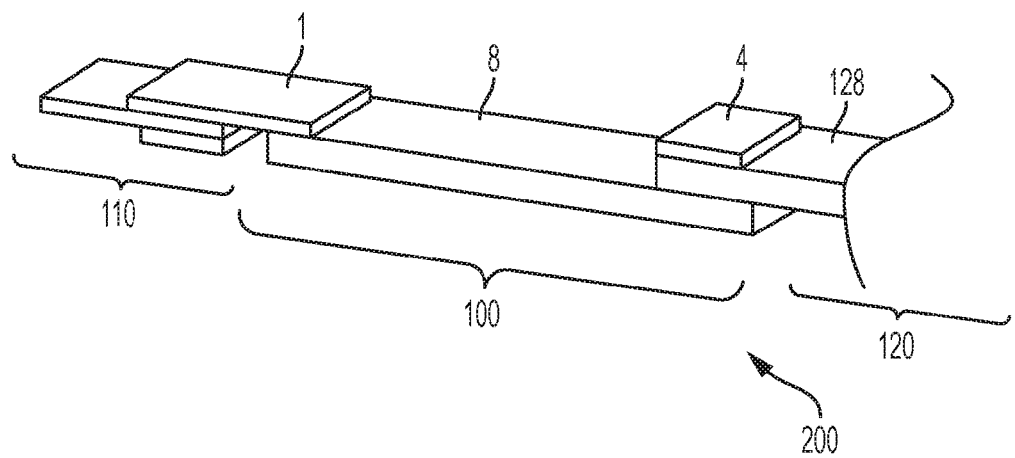
FIG. 4 depicts a 3D view of another system, comprising another spintronics device, coupled in output of a spin-orbit coupled device, according to embodiments.

Note that the 3D views of FIGS. 1, 3 and 4 are simplified, for conciseness. In other embodiments, devices may involve additional features and components not shown here. In particular, referring to FIG. 2, the confinement part 8 may comprises one or more layers 8, 87, 89, designed for confining charge carriers essentially in a two-dimensional area, in addition to a substrate (not shown). The carriers may for instance be electrons, which can be described as a 2D electron gas in such a two-dimensional area, i.e., an electron gas confined in essentially a two-dimensional area (subtended by the directions y and z, z being the principal [longitudinal] direction of the device 100). The confinement structure 8 may for instance comprise three or more layers 7, 8, 9 of semiconductor materials. The electron gas may for example be confined in a single layer 8 of semiconductor material, or at an interface 87 or 89 between two contiguous layers 7, 8 or 8, 9. Additional layers may be involved. The layers 7, 8, 9 may themselves decompose into sub-layers, as needed, to achieve a 2D electron gas. In other embodiments, the electron confinement layer may be formed at an interface between a layer of semiconductor material and an additional layer of a semiconducting, metallic or insulating material as discussed in more detail herein.

In an embodiment, the confinement part 8 comprises one or more non-magnetic semiconductor layers. For instance, the embodiment of FIG. 2 may be regarded as involving only non-magnetic semiconductor layers 7, 8 and 9.

In embodiments, the confinement materials (e.g., for layer 8 in FIGS. 1-3) are chosen such that charge carriers exist, which carry a spin and can be subject to drift under an electric field. In addition, the carriers should undergo spin rotations when drifting. The spin rotation may be determined by the propagation of the charge carriers between the scattering events and not by the scattering events themselves, such that the spin rotation between the scattering events depends in a non-linear way on the drift velocity. Most non-magnetic semiconductors with zinc blende structure fulfill such requirements. Other materials such as evoked earlier satisfy these requirements as well.

Yet, other materials than non-magnetic semiconductor layers can be contemplated, which exhibit non-linear spin-orbit interactions. Since efficient spin injection and detection mechanisms are known, the present approach may use any suitable material exhibiting substantial non-linear spin-orbit interaction.

In still other embodiments, (quasi) one-dimensional devices can be contemplated, wherein charge carriers are enabled to drift along a given direction (i.e., one-dimensional), whereas the dimensions, in a plane perpendicular to that direction, of the material hosting the charge carriers is smaller than the spin-orbit length of that material. In other words, a (quasi) one-dimensional system is confined with respect to two dimensions whereas, e.g., a (quasi) two-dimensional electron gas is confined with respect to the direction perpendicular to the two-dimensional area.

Devices 100 such as described above, in reference to FIGS. 1 and 2 can be provided to convert current into a desired spin-polarization. Additional considerations and implementation details are discussed herein.

In addition, the above devices may be used to amplify spin-polarizations as obtained in output of a spintronic device, as explained now in reference to FIGS. 3 and 4. In that respect, embodiments may be provided for a spin-amplification system 200, where the system 200 comprises a spin-orbit coupled device 100 as discussed above. In addition, the system 200 comprises a spintronic device 110, coupled to the spin-orbit coupled device 100. The spintronic device 110 is configured for obtaining charge carriers having given spin polarizations $S_Z^{in}$ in an output region 140 thereof. The circuitry 1, 4 discussed earlier in reference to FIGS. 1, 2 may here be modified to include a spin-to-current converter 114, 1, coupling the spintronic device 110 to the input region 10 of the spin-orbit coupled device 100.

This way, spin-polarization 2 can be injected in the input region 10, in accordance with a current produced by the spin-to-current converter 114, 1, but based on spin polarizations "$S_Z^{in}$" of charge carriers as obtained in output 140 of the coupled spintronic device 110. In addition, the circuitry 1, 4, 114 of the spin-orbit coupled device 100 may be set so as to amplify the spin-polarizations $S_Z^{in}$. For example, spin-polarizations "$S_Z^{out}$", as detectable in the output region 40 of the spin-orbit coupled device 100, may accordingly be amplified with respect to spin-polarizations $S_Z^{in}$ of charge carriers as obtained in output 140 of the spintronic device 110.

As used herein, the term "amplified" means that the component of the spin polarization $S_Z^{out}$, as projected along a direction z, is larger (by a certain amplification factor) than the component of spin polarization $S_Z^{in}$, as projected along the same (or even a different) direction. In order to achieve such an amplification, the magnitude of spin polarization $S_{inj}$ injected into region 10 need be larger than the maximum desired for the component $S_Z^{in}$ to be amplified. As used herein, the term "amplitude" may also denote the component of a spin polarization as projected along a certain direction.

The amplification of $S_Z^{in}$ may for instance operate by first converting $S_Z^{in}$ of charge carriers as obtained in output 140 of the spintronic device 110 into a current, using the spin-to-current converter 114, 1. Then, this current is used to inject spin polarization $S_{inj}$ into region 10 of the spin-orbit coupled device 100, via the input contact 1. Finally, using the properties of the spin-orbit coupled device 100, the injected spin-polarization $S_{inj}$ can be propagated up to region 40, whereby the current as initially converted from $S_Z^{in}$ is finally converted to $S_Z^{out}$.

If linear spin-amplification is desired (FIG. 7, in the context of FIG. 3), the circuitry can be calibrated (e.g., by design or by applying a voltage V) so that, for $S_Z^{in}=0$, we get $S_Z^{out}=0$. It is noted that the current amplitude as obtained via the spin-to-current converter 114 not only depends on the spin polarization in region 140, but also on the voltage V applied (with respect to the ground at the contact 116).

If, now, $S_Z^{in}$ differs from zero, the current amplitude varies accordingly, thus changing the rotation angle of the spin polarization at $S_Z^{out}$, owing to the non-linear spin-orbit interaction. As a result, $S_Z^{out}$ (as detectable at the level of the output region 40) can thus be amplified with respect to $S_Z^{in}$ (as obtained in output 140 of the spintronic device 110). Note that amplification may occur even if the spin polarizations in region 40 are typically smaller than polarizations in region 10, because of the fresh, large spin polarization repeatedly injected into region 10 via the converter 114, 1.

Referring now more specifically to FIG. 3, in embodiments, the spin-to-current converter 114, 1 may comprise a spin-sensitive resistance 114, for converting $S_Z^{in}$, as obtained in output 140 of the spintronic device 110, into a current amplitude. The spin-sensitive resistance 114, 1 may for instance be formed thanks to a ferromagnetic layer and, in particular, at an interface between a semiconductor layer and a ferromagnetic contact layer. In the embodiment shown in FIG. 3, the spin-to-current converter re-uses a semiconductor layer 118 of the device 110. For example, the spin-sensitive resistance 114 is formed at an interface between the semiconductor layer 118 of the device 110 and the ferromagnetic contact layer 1, for efficiency.

As described herein, in some embodiments, only the projection of the spin amplitude along a certain direction is relevant. This direction can, for instance, be defined by the magnetization axis of the ferromagnetic contact 1, which may coincide with the longitudinal direction z, as assumed in FIGS. 1-4.

Figure 5:
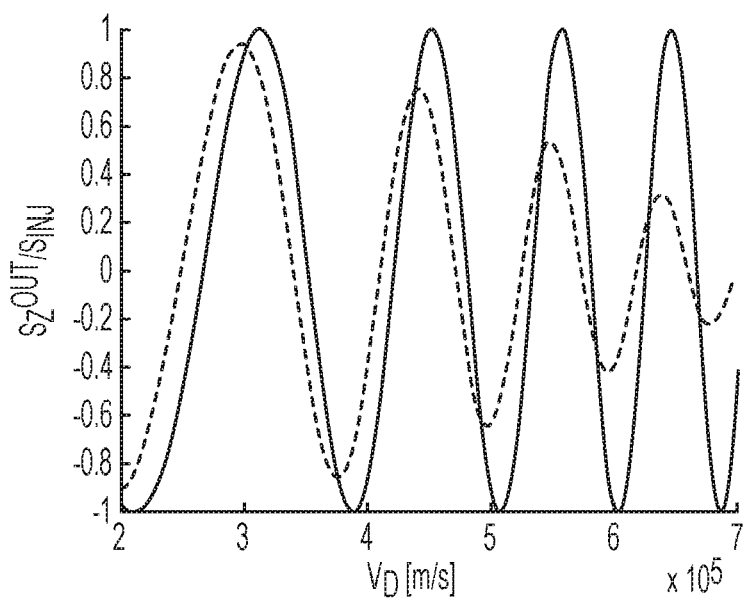
FIG. 5 depicts a plot illustrating the theoretical dependence of the amplitude of the spin-polarization (projected along the principal direction of the device) on the drift velocity, both in an ideal case (plain line, assuming no diffusion) and taking into account spin diffusion (dashed line), according to some embodiments.
Figure 6:
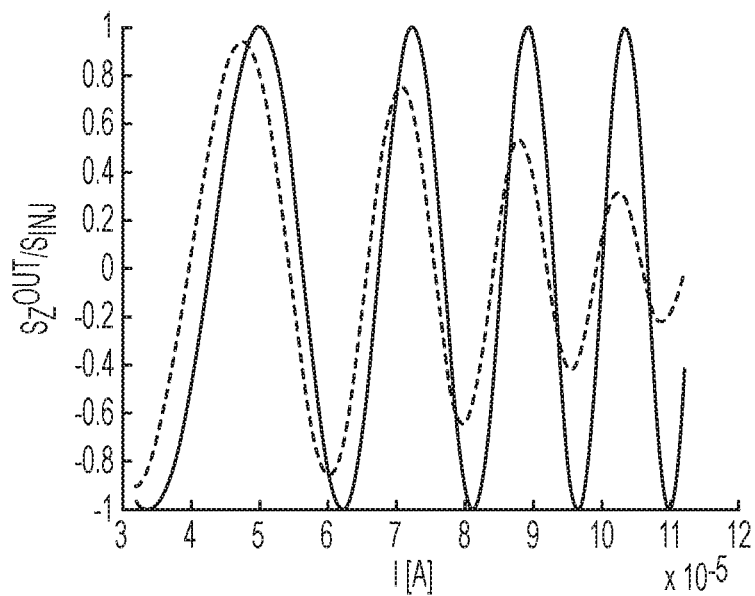
FIG. 6 depicts a theoretical dependence of the amplitude of the spin-polarization on the current associated to drifting charge carriers), according to some embodiments.

As illustrated in FIG. 6, the spin-polarization $S_Z^{out}$ of charge carriers, as detectable in the output region 40 of the spin-orbit coupled device 100 is typically an oscillatory function of the electrical current associated to momenta of charge carriers drifting in the confinement part 8. This arises due to the fact that $S_Z^{out}=S_{inj}\cos(\phi)$ depends on $v_D$, e.g., as per the previous formula of $\phi$. The quantity $S_{inj}$ refers to the degree of spin polarization injected at point A. For the same reasons, the spin-polarization $S_Z^{out}$ as detectable in the output region 40 will be an oscillatory function of $v_D$ (FIG. 5) or, still, an oscillatory function of the associated resistivity (FIG. 8), where the change of resistivity essentially stems from, e.g., the spin-selective contact 114. The resistivity is in fact associated to the series resistance of the spin-dependent resistance 114 and all other resistances until the drain contact 40.

Still, the circuitry 1, 4, 114 can be set so as to exploit a linear regime of this oscillatory function. As a result, spin polarizations $S_Z^{in}$ from the output region 140 of the spintronic device 110 can be amplified so as for the resulting amplified spin-polarizations $S_Z^{out}$ to be essentially linearly dependent on the current I associated to $v_D$ (FIG. 6). This is discussed in more detail herein.

In embodiments, the spintronic device 110 in the system 200 (FIG. 3) is a spin-based majority logics device. The latter will typically be configured for obtaining charge carriers having a given spin polarization as output, in accordance with a logic operation of spin polarizations as injected as inputs of the majority logics device, and as known per se. As it can be realized, the oscillatory behavior of the spin-polarizations $S_Z^{out}$ can advantageously be exploited and advantage taken from the non-linearity of this function so as for distinct values of spin polarizations (as obtained in output 140 of the spintronic device) to result in essentially a same amplified value of spin-polarization, as detectable in the output region 40 of the spin-orbit coupled device 100.

Figure 8:
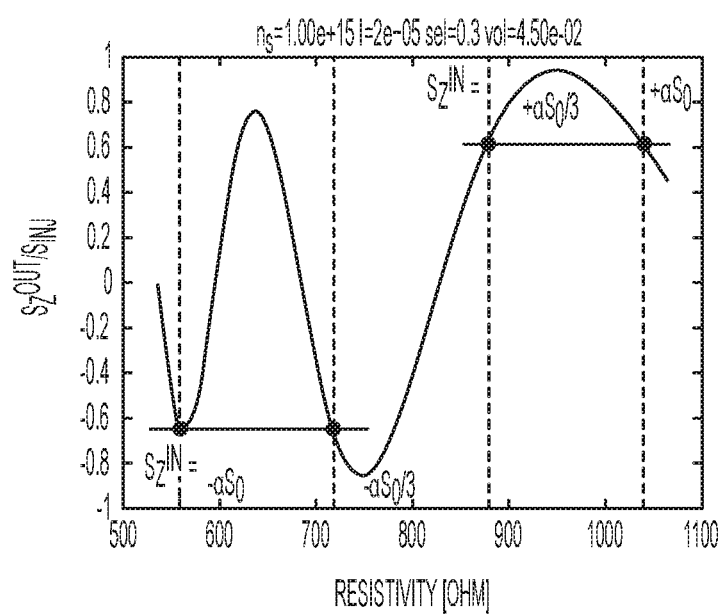
FIG. 8 depicts a plot illustrating the theoretical dependence of the amplitude of the spin-polarization on a resistivity and how the non-linear behavior of such a function can be exploited in majority logic applications. The dashed lines mark four possible outcomes of a majority logic operation as enabled by a majority logic device coupled to a spin-orbit coupled device (as in the configuration of FIG. 3)), according to some embodiments.

For instance, referring to FIG. 8, a spin-amplification system can be provided, wherein the circuitry 1, 4 is set to amplify distinct sets of values of spin polarizations (namely $[-\alpha S_0/3, -\alpha S_0]$ and $[\alpha S_0/3, \alpha S_0]$) as obtainable in output 140 of the spintronic device 110, where a is a spin polarization decay factor. Note that, in each of the two sets, the values ($\pm\alpha S_0/3, \pm\alpha S_0$) of spin polarizations are distinct and of a same sign, whereas the values ($-\alpha S_0/3, -\alpha S_0$) of the first set have a sign opposite to the values ($\alpha S_0/3, \alpha S_0$) of the second set. Still, and for each of the two sets, distinct values of spin polarizations (as obtained in output of the spintronic device 110) may result in essentially a same amplified value$\pm S_0$ of spin-polarization (as detectable in the output region 40 of the device 100), by virtue of said oscillatory function. Namely, in FIG. 8, $\alpha S_0/3$ and $\alpha S_0$ are each amplified to $S_0$, whereas $-\alpha S_0/3$ and $-\alpha S_0$ are each amplified to $-S_0$. This is discussed in more detail herein.

In embodiments, the spintronic device 110 of the spin-amplification system 200 may be configured as a logic gate. In that respect, it may be desired to obtain a cascade of logic gates (and, more generally, a cascade of majority logics devices), where intermediate spin-polarizations need be amplified, a thing that is possible thanks to embodiments of the invention.

In that respect, and as illustrated in FIG. 4, the spin-amplification system 200 of FIG. 3 may be augmented with an additional spintronic device 120, coupled to the spin-orbit coupled device 100, via the output device 4 of the latter. The additional spintronic device 120 may, again, be a spin-based majority logics device, so as to obtain a cascade of majority logics devices, with intermediate re-amplification of spin-polarization signals. The additional spintronic device 120 may for instance be configured as a logic gate, so as to obtain a cascade of logic gates.

According to another aspect, the invention can be embodied as a method for rotating (and possibly amplifying) spin-polarizations. The method utilizes a spin-orbit coupled device 100 such as discussed earlier in reference to FIGS. 1 and 2. The steps of such methods have already been implicitly described in reference to the corresponding device 100 and systems 200; they are only briefly discussed here. Essentially, present methods revolve around a step, during which momenta of charge carriers drifting in the confinement part 8 are varied (e.g., via a circuitry 1, 4, as described earlier) and, this, while injecting spin-polarizations in the input region 10 of the device 100.

This may be achieved by applying a voltage V across the confinement part 8, so as to change the value of the potential governing the confinement part 8 and therefore accelerate electrons. Still, as noted earlier, the applied voltage might be kept constant, in some specific embodiments such as discussed above in reference to FIGS. 3 and 7 (where the current flowing in the channel 8 nevertheless changes).

As explained before, varying momenta of the drifting carriers results in rotating spin-polarizations of charge carriers travelling from the input region 10 to the output region 40, owing to said non-linear spin-orbit interaction. The carrier momenta are varied concomitantly to the spin injection. In embodiments, present method may include a step of detection of spin-polarizations of charge carriers, at the level of the output region 40. Detection can be performed via the output device 4. Technical implementation aspects of this embodiment are described in more detail herein.

As already discussed in reference to FIGS. 3 and 4, embodiments of the present methods make use of a system 200 where a spintronic device 110 is coupled to the input region 10 of the spin-orbit coupled device 100. Spin-polarizations may accordingly be injected in the input region 10 of the latter in accordance with a current produced by a spin-to-current converter 114, 1, yet based on spin polarizations $S_Z^{in}$ of charge carriers as obtained in output 140 of the spintronic device 110. In addition, the circuitry 1, 4, 114 may be set so as to amplify spin-polarizations $S_Z^{out}$ as detectable in output 40 of the device 100 with respect to spin-polarizations $S_Z^{in}$.

Figure 7:
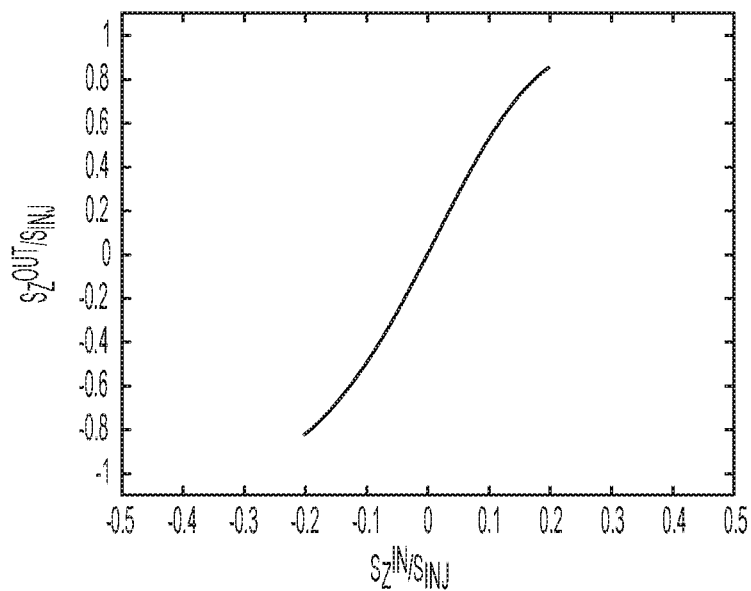
FIG. 7 depicts a plot illustrating an approximate linear dependence between the amplitude of the spin-polarizations as detectable in an output region of a spin-orbit coupled device and the amplitude of spin-polarizations as obtainable in output of a spintronic device coupled thereto, as in the system of FIG. 3, so as to enable a linear amplification), according to some embodiments.

In particular, by exploiting a linear regime of the oscillatory spin-polarization, the amplified spin-polarizations will be essentially linearly dependent on the electrical current associated to the drifting carriers, see FIG. 7.

On the contrary, one may want to exploit the non-linear regime of this function, such that distinct values of spin polarizations as injected via the input device 1 result in essentially a same amplified value of spin-polarization $S_Z^{out}$ in the output region 40 of the spin-orbit coupled device 100. This is discussed in more detail herein.

The above embodiments have been succinctly described in reference to the accompanying drawings and may accommodate a number of variants. Several combinations of the above features may be contemplated. Examples are given in the next section.

Current-to-Spin Conversion Embodiment

Embodiments discussed here allow the conversion of an electrical current into a positive or negative spin polarization, depending on the size of the current. As the one skilled in the art may realize, such a functionality is desired for spin-based electronics circuits. Furthermore, this functionality can advantageously be exploited in embodiments discussed herein.

The underlying device 100 (FIGS. 1, 2) comprises a two-dimensional charge carrier system. In such a system, the charge carriers (hereafter assumed to be electrons) experience cubic spin-orbit interaction, i.e., the spin-orbit interaction depends on the third power of the electron momentum. Such as in embodiments using materials such as III-V electron systems, Silicon and III-V hole systems, perovskites, and transition-metal-dichalcogenides.

An embodiment is provided so as for the spin-orbit interaction to substantially depend on the cubic term. If this cubic interaction is small, then the distance between the contacts 10, 40 need be made larger. In other words, the cubic spin-orbit interaction may be strong enough so as to achieve the desired effect, it being given some device dimensions. Conversely, for a given cubic spin-orbit interaction, the device's dimensions may need be adapted.

In such a device 100, the spin orientation at position B depends on the electrical current that flows from point A, where electrons have a defined spin polarization, to point B. Let l be the distance between points A and B.

Because of the spin-orbit interaction, a moving electron experiences an effective magnetic field, about which the electron's spin precesses. In the case of linear spin-orbit interaction, the precession angle of a spin that moves from A to B with a drift velocity $v_D$ depends only on l, as seen in sect. 1. However, in the case of non-linear spin-orbit interaction (e.g., if the interaction energy depends on the cube of the electron momentum), the device may function as a current-to-spin converter, as the precession angle of the spin depends not only on the distance travelled but also on the velocity.

As a result, the amplitude $S_z^{out}$ is an oscillatory function that depends on the drift velocity. FIG. 5 illustrates this, both in the ideal case (plain line) and when taking into account spin diffusion, which reduces the amplitude (dashed line, numerically calculated).

More in detail, the curves in plain lines (in FIGS. 5, 6 and 8) were obtained thanks to analytical formula given in sect. 1, whereas the dashed lines result from more sophisticated numerical calculations of the amplitude of $S_z$, which take into account the diffusive broadening of spins. Because of diffusion, the time to travel the distance from A to B is different for individual spins. When the average spin amplitude is measured at a distance l, the amplitude is decreased due to an averaging of spins with different drift velocities. As can be seen in FIG. 5, this effect is more pronounced towards higher drift velocities. Logically, the same trend is visible in FIG. 6, which illustrates the dependence of the amplitude $S_z^{out}$ on the current I associated to the drifting electrons.

The previous formula for the precession angle $\phi$ can be rewritten to show the dependence on the current, I, flowing through the system ($I = v_D e n_s b$), namely:

$$\phi = -\frac{2\pi m^* n_s}{\hbar^2}\gamma l - \frac{m^{*3}}{e^2\hbar^4}\frac{\gamma}{n_s^2}\frac{l}{b^2}I^2, \quad (3)$$

where b is the width of the transport channel and e is the charge of a single electron.

$S_z^{out}$ is plotted against the current in FIG. 6. As seen in FIG. 6, the orientation of the spin polarization is an oscillating function of the current as well, owing to $S_z^{out} = S_{inj} \cos(\phi)$. Thus, spins of opposite orientation can be generated by varying the current.

The above dependence offers rich possibilities for the design of functionalities of spin-based devices. For instance, a working point at a zero transition of $S_z^{out}$ offers an approximately linear characteristic of spin-to-current conversion and might be used for spin amplification (FIG. 7, sect. 2.2). Furthermore, non-linearity can be leveraged too, for example in applications to majority logics (FIG. 8, sect. 2.3).

FIG. 1 shows a possible realization of a device 100, where spin polarization is injected in region 10 (i.e., at position A). Spin injection can for instance be achieved using a ferromagnetic contact 1, possibly in combination with a tunnel barrier. The current for given $n_s$, l and b, depends on the voltage, V, applied across the confinement part, via a drain contact 4 and the ferromagnetic contact 1.

The orientation of the spin at the drain contact is a measure for the current flowing through the device. Thus, the device 100 acts as a current-to-spin converter.

Spin Amplifier Based on Current-to-Spin Converter Embodiment

In some embodiments, spin decay may be an issue for spin-based devices. Particularly the realization of a cascade of dependent logic units remains difficult because spin polarization degrades from unit to unit.

One approach provided herein allows spin amplification, using the following steps: spin polarization as obtained in output of a spintronic device is encoded into an electrical current; this information is converted to and passed via an electrical current (possibly over large distances), and then it is converted back into a spin polarization with amplified amplitude, by way of a current-to-spin converter as disclosed herein (sect. 2.1).

FIG. 3 shows a schematic sketch of a current-to-spin converter (as in FIG. 1), coupled to a spin-based logic processing unit (or any other device that outputs a spin polarization), in order to amplify spin polarization. Again, one considers here the projection of spin polarizations, $S_z$, onto the longitudinal (principal) axis, z, which can be defined, for instance, by the magnetization axis of the ferromagnetic contact 1.

The system 200 depicted in FIG. 3 makes it possible to convert an input spin polarization projection, $S_z^{in}$, into an electrical current, thanks to a spin-to-current converter 114, 1, and feed the obtained current into the current-to-spin converter 100.

One possible way to achieve spin-to-current conversion makes use of a spin-dependent interface resistance 114 between a semiconductor 118 and a ferromagnetic contact 1. In variants, other spin-to-current conversion methods can be contemplated that rely, e.g., on the reverse spin-Hall effect.

In the system 200 of FIG. 3, the spin amplitude, $S_z^{in}$, as obtained in output 140 of the spin-device 110, need be amplified. To that aim, it is converted into a current by way of the spin-selective contact 114. The obtained current is then transported via an electrical connection (if necessary over large distances) to a current-to-spin converter 100 as discussed earlier in reference to FIG. 1. In FIG. 3, the current is transported directly through the ferromagnetic contact 1. However, other embodiments can be contemplated, which allow a large spatial separation of the building blocks 110, 100.

Then, a spin injection contact 1 injects spins 2 in accordance with the previously converted current, into the current-to-spin converter 100 at position A. The spin polarization at point A, $S_{inj}$, is notably impacted by the spin injection efficiency of the spin injection contact 1.

The resistance at the interface 114 depends on the spin amplitude, $S_z^{in}$, of the input spins. For illustration, the spin-to-current converter 114, 1 may be assumed to have the following characteristic: $R = R_0 (1 - \text{Sel } S_z^{in})$, where $R_0$ is the base resistance of the device for unpolarized spins, and Sel denotes the spin-selectivity of the contact 114 (the maximum value of Sel being 1). Thus, the spin-to-current converter 114, 1 has a resistance $R_0$ for unpolarized spins, a resistance $R_0 + \text{Sel}$ for $S_z^{in} = -1$ and a resistance $R_0 - \text{Sel}$ for $S_z^{in} = +1$.

The current-to-spin converter, as described earlier, rotates the spin polarization at position A as the spins travel to point B by an angle $$\phi = -\frac{2\pi m^* n_s}{\hbar^2}\gamma l - \frac{m^{*3}}{e^2\hbar^4}\frac{\gamma}{n_s^2}\frac{l}{b^2}\frac{V^2}{R^2}. \quad (4)$$

Because R depends on $S_z^{in}$, $S_z^{out}$ depends on $S_z^{in}$.

For a suitable choice of material parameters, the device can be tuned to a working point close to a zero transition of the characteristics of the current-to-spin converter (see FIG. 6). The device then functions as a spin amplifier, due to an approximately linear input-output characteristic.

For example, the following parameters (Table I) lead to the characteristics as plotted in FIG. 7.

TABLE I

| | | |
|---|---|---|
| m* | 0.067 * $m_e$ | Effective electron mass in GaAs |
| γ | 10e−30 eVm² | Cubic spin-orbit coefficient in GaAs |
| $n_s$ | 1e15 m$^{-2}$ | Typical electron sheet density in a GaAs quantum well |
| l | 20e−6 m | Length of the channel |
| b | 1e−6 m | Width of the channel |
| $R_0$ | 685.5 Ω | $R_0$ is the base resistance of the device for unpolarized spins |
| Sel | 0.3 | Resistance increase if one channel turns from up to down |
| Ds | 0.003 m²/s | Spin diffusion constant |
| V | 45 mV | Voltage applied (constant) along the cubic channel |

Steeper slopes and thus higher amplification factors can be realized by tuning the parameters. Materials with stronger cubic spin-orbit interaction, i.e., larger values for γ, yield larger amplification factors.

Nonlinear Spin Amplifier and Spin Amplification in Majority Logics Embodiment

Concepts based on majority logics relate the spin polarization of a number of input electrodes to the spin polarization of an output electrode, where the output spin polarization is a logic operation of the spin polarization of the individual input electrodes. In the majority logic concept, the output is defined by the sign of the output polarization which represents an average of the input polarizations. The overall magnitude of spin polarization may have decreased at the output electrode as compared to the level of spin polarization of the input electrodes. In order to cascade logic gates, the output spin polarization of gate n needs to be amplified before it can serve as an input spin polarization for gate n+1.

Concepts for such spin amplifiers have been proposed, which rely on using a weak spin polarization to orient the polarization of a ferromagnetic material with a magnetization that is prepared in an unstable equilibrium into one of the two stable positions with opposite magnetizations.

The system in this subsection provides an alternative to such concepts. It utilizes the nonlinearity of a current-to-spin converter 100 as described earlier to enable spin-based majority logics.

Again, the projection of spin polarization, $S_z$, onto the principal axis, z is considered, defined by the magnetization axis of the ferromagnetic contact 1, FIG. 3.

The majority logic device 110 consists of at least three separate input channels and one output channel (not shown). The values of $S_z$ at the inputs of the majority logic gate is either +$S_0$ or −$S_0$. The output of the majority logic is the average of the input channels, decreased by a factor α that takes into account the decay of spin polarization during the averaging.

In case of three input channels, the output of one majority logic gate has the following possible values: +$\alpha S_0$, −$\alpha S_0$, +$\alpha S_0/3$ or −$\alpha S_0/3$. For the latter two results, the spin polarization is decreased by a factor ⅔. The maximum output amplitude of the majority logic gate is, therefore, given by $\alpha S_0$.

In order to enable cascading gates in majority logics, the output of one gate has to be amplified before passing it on to the next gate, such that each of the values $\alpha S_0$ and $\alpha S_0/3$ is amplified to $S_0$ and the values −$\alpha S_0$ and −$\alpha S_0/3$ are amplified, each, to −$S_0$ (majority vote).

A system similar to that of FIG. 3 may hence be used, wherein the coupled device 110 is a spin-based majority logics device. The output of the majority logic operation is thus connected to the input, $S_z^{in}$ of the spin amplifier system as described in sect. 2.2.

As described in the previous subsection, the resistance of the spin amplifier may be assumed to be given by R=$R_0$ (1−Sel $S_z^{in}$). Thus, the device resistance depends on the outcome of the majority logic operation as given in the following table:

TABLE II

| $S_z^{in}$ | R |
|---|---|
| −$\alpha S_0$ | $R_0$ (1 − Sel) |
| −$\alpha S_0/3$ | $R_0$ (1 − Sel/3) |
| +$\alpha S_0/3$ | $R_0$ (1 − Sel/3) |
| +$\alpha S_0$ | $R_0$ (1 + Sel) |

At point A the spin injection contact injects spin with a spin polarization $S_{inj}$. The system 200 (FIG. 3) and material parameters are chosen such that the majority vote is achieved. This is possible by extending the input-output characteristics of the spin amplifier to the non-linear regime, as illustrated in FIG. 8.

For instance, a suitable set of parameters is that given in Table I, except for the resistance R, which, for the (up, up, up) case is assumed to be equal to 800Ω. FIG. 8 plots the corresponding device characteristics (dashed lines mark the four possible outcomes of the majority logic operation).

The following table (Table III) gives an overview of the logic operations for this specific set of parameters. Tuning such parameters and/or to other materials than GaAs may enhance the operation quality in terms of magnitude of $S_z^{out}$, as well as meeting the criterion of the majority vote.

TABLE III

| $S_z^{in}$ | R | $S_z^{out}$ |
|---|---|---|
| −$\alpha S_0$ | 0.56 kΩ | −0.63 $S_{inj}$ |
| −$\alpha S_0/3$ | 0.72 kΩ | −0.66 $S_{inj}$ |
| $\alpha S_0/3$ | 0.88 kΩ | +0.63 $S_{inj}$ |
| $\alpha S_0$ | 1.04 kΩ | +0.60 $S_{inj}$ |

Note that $S_z^{out}$ is the output of the amplifier and, at the same time, the input of the following majority gate 120 (for which $S_0$=$S_z^{out}$), and so on, so as to obtain a cascade of logic gates.

The above example demonstrates a majority vote with four possible input states. Often in majority logic gates, only three out of the four input states occur. The following logic table (Table IV) illustrates a logic OR gate, where one of the three inputs is constantly set to 1. Only the output polarizations $\alpha S_0$, $\alpha S_0/3$ and −$\alpha S_0/3$ occur. This makes it easier to find suitable parameters for implementing the majority vote.

TABLE IV

| Control input | Bit 1 | Bit 2 | Output |
|---|---|---|---|
| $S_0$ | $S_0$ | $S_0$ | $\alpha S_0$ |
| $S_0$ | $S_0$ | −$S_0$ | $\alpha S_0/3$ |

TABLE IV-continued

| Control input | Bit 1 | Bit 2 | Output |
|---|---|---|---|
| $S_0$ | $-S_0$ | $S_0$ | $\alpha S_0/3$ |
| $S_0$ | $-S_0$ | $-S_0$ | $\alpha S_0/3$ |

In reference to FIG. 1-3, the confinement part 8 includes a spin transport layer (or STL) above a substrate. The STL may be obtained by way of semiconductor layers 7, 8, and 9 hosting the 2D electron gas. The 2D electron gas can for example be confined to a quantum well, e.g., to semiconductor layer 8, where electrons are in states of lower energy than in the surrounding layers 7 and 9. In variants, the 2D electron gas can be located at an interface, i.e., between layer 8 and either layer 7 or 9. The electrons in that 2D electron gas are typically provided by dopants in layers 7, 8 and/or 9. The material of such semiconductor layers can be alloys and ternary alloys of III-V materials (e.g., GaAs, AlAs, InAs, InP or InSb) or, even, II-VI materials (e.g., CdSe, CdTe or ZnSe).

In some embodiments, the 2D electron gas may be formed within a single semiconductor layer, at the interface with a contiguous insulating or metallic layer, and electrons are provided by field-effect using an electric field. In addition, an electric field applied perpendicular to the layer may be used to condition the system, if necessary.

Connected to the 2D electron gas are input 1 and output 4 electrodes, as evoked earlier. The input electrodes act as spin injection contacts and consist of a magnetic material that is magnetized into one of two directions, i.e., spin up or spin down, as denoted by reference 2 in FIG. 1, 2. In the example of FIG. 1, the injection direction is along direction z. By passing a current between the input electrodes and the 2D electron gas, spin-polarized electrons can be accumulated in the 2D electron gas in a given injection region 10, e.g. at the interface between the input electrode and the 2D electron gas. The spin polarization of the electrons at that location in the 2D electron gas is directly related to the magnetization of the input electrode, i.e., the spins in the 2D electron gas are also either up or down. The output electrodes 4 may be used to convert the local spin polarization in the output region (typically at the interface between the 2D electron gas and the output electrode) into either an electrical signal or into a magnetization state of another input electrode: the latter can be the output electrode or another electrode close-by that takes over the spin polarization of the 2D electron gas at the interface.

In between the input and output electrodes, the spin polarization imprinted by the input electrode propagates in the 2D electron gas by drift (and also by diffusion).

The spins of the electrons in a 2D electron gas hosted in a semiconductor heterostructure are subject to spin-orbit interaction (SOI). There are two separate contributions to SOI. One contribution originates from the bulk inversion-asymmetry, e.g., of III-V and II-VI semiconductor materials (BIA). The second contribution originates from structure inversion asymmetry (SIA) that can be engineered by choosing different materials for layers 7, 8, 9 in FIG. 1 or different doping concentrations on the two sides 7 and 9 of the 2D electron gas.

The period of the spin oscillation is determined by the spin-orbit length $l_s$ that is determined by the strength of the SOI and the mass of the electron. The spin-orbit length can be in the range of 10 nm to 10 μm for typical III-V and II-VI materials. It can be tuned to some extent by gate electrodes above and/or below the 2D electron gas.

A working sequence of semiconductor layers, e.g., grown by molecular beam epitaxy, is the following (from the bottom-to-top):
  Substrate: GaAs (001) wafer;
  Layer 9 may comprise, successively,
    500 nm $Al_{0.3}Ga_{0.7}As$
    Si doping in a delta layer, ~6 10" $cm^{-2}$; and
    20 nm $Al_{0.3}Ga_{0.7}As$
  Central layer 8 may comprise 12 nm GaAs; and
  Layer 7 may finally decompose into:
    90 nm $Al_{0.3}Ga_{0.7}As$; and
    5 nm GaAs.

Typical current intensity/voltages used to "energize" the electrodes shall depend on the specific realization of spin injection contacts. As used herein, the term "Energizing" the electrode may typically involve:

pass an electrical current between the ferromagnetic electrode 1 and the 2D electron gas (possibly involving second contacts below the 2D electron gas and the ferromagnetic contact). The direction of the current determines the polarization direction of the spins (along or against the magnetization of the electrode). Alternatively, the magnetization of the electrode can be reversed by a local magnetic field or by spin transfer torque;

excite spin-polarized electrons into the conduction band using circularly polarized photons. The helicity of the circular polarization (right-circularly polarized or left-circularly polarized) determines the direction of the excited spin polarization; or any other technique that allows for creation of local spin polarization, i.e. current-induced spin polarization, spin-dependent tunneling, etc.

Reading out the spin at the output is for example done by measuring a current between the 2D electron gas and a ferromagnetic layer 1. At a given voltage, the current is higher or lower depending on the direction of the spin polarization in the 2D electron gas below the output electrode with respect to the magnetization of the ferromagnetic layer.

In an embodiment, a method for rotating spin-polarization in a spin-orbit coupled device is provided. The method comprising: providing a spin-orbit coupled device, comprising: a confinement part, configured to confine charge carriers likely to drift therein, and configured to subject charge carriers drifting therein to a non-linear spin-orbit interaction, which causes to rotate a spin polarization of drifting charge carriers by an angle that depends non-linearly on momenta of such charge carriers; and a circuitry, the latter comprising: an input device, energizable to inject spin-polarizations to charge carriers in an input region of the confinement part; and an output device, usable to detect spin-polarizations of charge carriers in an output region of the confinement part, and while injecting spin-polarizations in the input region, varying, via the circuitry, momenta of charge carriers drifting in the confinement part, to rotate spin-polarizations of the drifting charge carriers, owing to said non-linear spin-orbit interaction.

In an embodiment, the method further comprises detecting spin-polarizations of charge carriers in the output region. In an embodiment, the momenta of charge carriers is varied by applying a voltage across said confinement part.

In an embodiment, the method further comprises providing a spintronic device, configured for obtaining charge carriers having given spin polarizations in an output region thereof, wherein the circuitry comprises a spin-to-current converter coupling the spintronic device to the input region of the spin-orbit coupled device, and wherein, injecting spin-polarizations in the input region of the latter comprises injecting spin-polarizations in accordance with a current produced by the spin-to-current converter based on said given spin polarizations of charge carriers obtained in the output region of the spintronic device.

In an embodiment, the method further comprises setting the circuitry so as to amplify spin-polarizations as detectable in the output region of the spin-orbit coupled device with respect to spin-polarizations of charge carriers in said output region of the spintronic device.

In an embodiment the spin-orbit coupled device is provided that is configured such that a spin-polarization of charge carriers as detectable in the output region of the spin-orbit coupled device is an oscillatory function of an electrical current associated to momenta of charge carriers drifting in the confinement part, and wherein, setting the circuitry is performed so as to amplify spin polarizations from the output region of the spintronic device in a linear regime of said oscillatory function, such that resulting amplified spin-polarizations be essentially linearly dependent on said electrical current.

In an embodiment, the spintronic device provided is a spin-based majority logics device, configured for obtaining charge carriers having a given spin polarization as output, in accordance with a logic operation of spin polarizations as injected as inputs of the majority logics device; and the spin-orbit coupled device provided is configured such that a spin-polarization of charge carriers, as detectable in output of the spin-orbit coupled device, is an oscillatory function of the electrical current associated to charge carriers drifting in the confinement part, and the spin-to-current converter, and wherein, setting the circuitry is performed so as to amplify spin polarizations as obtained in output of the spintronic device in a non-linear regime of said oscillatory function, such that distinct values of spin polarizations as injected via the input device result in essentially a same amplified value of spin-polarization in the output region of the spin-orbit coupled device, by virtue of said oscillatory function.

In an embodiment, the setting the circuitry is performed so as to amplify two sets of values of spin polarizations as obtained in output of the spintronic device, and wherein, in each of the two sets, the values of spin polarizations are distinct and of a same sign, whereas the values of spin polarizations of one of the two sets have a sign opposite to the sign of the values of spin polarizations of the other one of the two sets, such that, for each of the two sets, distinct values of spin polarizations as obtained in output of the spintronic device result in essentially a same amplified value of spin-polarization as detectable in the output region of the spin-orbit coupled device, by virtue of said oscillatory function.

Technical effects and benefits of some embodiments include providing provide for converting an electrical current into a desired spin-polarization. Other embodiments utilize a linear regime of the function so that the amplified spin-polarizations may be linearly dependent on the electrical current associated to drifting carriers. Still further embodiments provide advantages for current-to-spin conversion, or spin amplification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A spin-orbit coupled device, comprising:
a confinement part; and
a circuitry, the circuitry comprising:
an input device, energizable to inject spin-polarizations to charge carriers in an input region of the confinement part; and
an output device, configured to detect spin-polarizations of charge carriers in an output region of the confinement part,
and wherein,
the circuitry is configured to apply a voltage difference across the confinement part to generate an electrical current that flows between the input device and the output device to subject charge carriers drifting in the confinement part to a non-linear spin-orbit interaction, which causes to rotate a spin polarization of a drifting charge carriers by an angle that depends non-linearly on momenta of such charge carriers; and
the circuitry is configured to allow momenta of charge carriers drifting in the confinement part to be varied, while injecting spin-polarizations in the input region, so as to rotate spin-polarizations of charge carriers drifting in the confinement part, owing to the non-linear spin-orbit interaction.

2. The spin-orbit coupled device according to claim 1, wherein the confinement part is configured so as for charge carriers drifting therein to experience a cubic spin-orbit interaction, whereby an energy of an interaction depends on a third power of momenta of the charge carriers.

3. The spin-orbit coupled device according to claim 1, wherein the input device comprises a ferromagnetic contact, in electrical communication with said confinement part.

4. The spin-orbit coupled device according to claim 1, wherein the electrical current associated to momenta of charge carriers drifting in the confinement part varies according to the voltage applied via the circuitry.

5. The spin-orbit coupled device according to claim 4, wherein:
the input device comprises a ferromagnetic contact, in electrical communication with the confinement part; and
the output device comprises a drain contact, in electrical communication with the confinement part, the circuitry configured to apply the voltage across the confinement part via the drain contact and the ferromagnetic contact.

6. The spin-orbit coupled device according to claim 1, wherein the confinement part comprises a confinement layer, the confinement layer configured for confining charge carriers essentially in a two-dimensional area.

7. The spin-orbit coupled device according to claim 1, wherein the confinement part comprises non-magnetic semiconductor layers.

8. A spin-amplification system comprising:
the spin-orbit coupled device according to claim 1; and
a spintronic device, configured for obtaining charge carriers having given spin polarizations in an output region thereof,
and wherein:
the circuitry comprises a spin-to-current converter coupling the spintronic device to the input region of the spin-orbit coupled device, such that spin-polarizations can be injected in the input region in accordance with a current produced by the spin-to-current converter based on spin polarizations of charge carriers as obtainable in the output region of the spintronic device; and
the circuitry is further configured to amplify spin-polarizations as detectable in the output region with respect to spin-polarizations of charge carriers as obtainable in the output region of the spintronic device.

9. The spin-amplification system according to claim 8, wherein the spin-to-current converter includes a spin-sensitive resistance, arranged so as for the spin-to-current converter to convert a spin polarization of charge carriers as obtainable in the output region of the spintronic device into a current.

10. The spin-amplification system according to claim 9, wherein the spin-to-current converter comprises a semiconductor layer and a ferromagnetic contact layer, the spin-sensitive resistance formed by an interface between the semiconductor layer and the ferromagnetic contact layer.

11. The spin-amplification system according to claim 8, wherein:
the spin-orbit coupled device is configure to provide spin-polarization of charge carriers, as detectable in the output region of the spin-orbit coupled device, is an oscillatory function of an electrical current associated to momenta of charge carriers drifting in the confinement part; and
the circuitry is configured to amplify spin polarizations from the output region of the spintronic device in a linear regime of said oscillatory function, so as for resulting amplified spin-polarizations to be essentially linearly dependent on said electrical current.

12. The spin-amplification system according to claim 8, wherein the spintronic device is a spin-based majority logics device, configured for obtaining charge carriers having a given spin polarization as output, in accordance with a logic operation of spin polarizations as injected as inputs of the majority logics device.

13. The spin-amplification system according to claim 12, wherein:
the spin-orbit coupled device is configured to provide a spin-polarization of charge carriers, as detectable in the output region of the spin-orbit coupled device, is an oscillatory function of the electrical current associated to momenta of charge carriers drifting in the confinement part; and
the circuitry is configured to amplify spin polarizations as obtainable in output of the spintronic device in a non-linear regime of said oscillatory function, so as for distinct values of spin polarizations as obtainable in output of the spintronic device to result in essentially a same amplified value of spin-polarization as detectable in the output region of the spin-orbit coupled device, by virtue of said oscillatory function.

14. The spin-amplification system according to claim 13, wherein the circuitry is configured to amplify two sets of values of spin polarizations as obtainable in output of the spintronic device, wherein, in each of the two sets, the values of spin polarizations are distinct and of a same sign, whereas the values of spin polarizations of one of the two sets have a sign opposite to the sign of the values of spin polarizations of the other one of the two sets, such that, for each of the two sets, distinct values of spin polarizations as obtainable as obtainable in output of the spintronic device result in essentially a same amplified value of spin-polarization as detectable in the output region of the spin-orbit coupled device, by virtue of said oscillatory function.

15. The spin-amplification system according to claim 12, wherein the spintronic device is configured as a logic gate.

16. The spin-amplification system according to claim 12, further comprising a further spintronic device, coupled to the spin-orbit coupled device, via the output device of the latter.

17. The spin-amplification system according to claim 16, wherein the further spintronic device is configured as a logic gate.

18. A method for rotating spin-polarization in a spin-orbit coupled device, the method comprising:
providing a spin-orbit coupled device, comprising:
a confinement part, configured to confine charge carriers likely to drift therein, and configured to subject charge carriers drifting therein to a non-linear spin-orbit interaction, which causes to rotate a spin polarization of drifting charge carriers by an angle that depends non-linearly on momenta of such charge carriers; and
a circuitry, the circuitry comprising:
an input device, energizable to inject spin-polarizations to charge carriers in an input region of the confinement part; and
an output device, usable to detect spin-polarizations of charge carriers in an output region of the confinement part, and
while injecting spin-polarizations in the input region, applying, via the circuitry, a voltage difference across the confinement part to generate an electrical current that flows between the input device and the output device to vary momenta of charge carriers drifting in the confinement part, to rotate spin-polarizations of a drifting charge carriers, owing to said non-linear spin-orbit interaction.

19. The method of claim 18, further comprising detecting spin-polarizations of charge carriers in the output region.

* * * * *